United States Patent [19]

Martin et al.

[11] Patent Number: 4,680,605
[45] Date of Patent: Jul. 14, 1987

[54] HIGH VOLTAGE DEPLETION MODE TRANSISTOR WITH SERPENTINE CURRENT PATH

[75] Inventors: Russel A. Martin, Santa Monica; Steven A. Buhler, Redondo Beach, both of Calif.

[73] Assignee: Xerox Corporation, Stamford, Conn.

[21] Appl. No.: 818,384

[22] Filed: Jan. 13, 1986

Related U.S. Application Data

[63] Continuation of Ser. No. 588,172, Mar. 12, 1984, abandoned.

[51] Int. Cl.$^4$ ............... H01L 29/06; H01L 29/78; H01L 27/02; H01L 29/34
[52] U.S. Cl. ............... 357/23.11; 357/20; 357/41; 357/52
[58] Field of Search ............... 357/52, 20, 23.1, 23.8, 357/23.11, 23.12, 41, 47, 53, 52

[56] References Cited

U.S. PATENT DOCUMENTS

| | | | |
|---|---|---|---|
| 3,440,502 | 4/1969 | Lin et al. | 357/52 |
| 3,602,782 | 8/1971 | Klein | 357/53 |
| 3,643,139 | 2/1972 | Nienhuis | 357/23.11 |
| 3,896,483 | 7/1975 | Whelan | 357/23.12 |
| 4,247,860 | 1/1981 | Tihanyi | 357/23.12 |
| 4,282,539 | 8/1981 | Schrader | 357/41 |
| 4,350,991 | 9/1982 | Johnson et al. | 357/23.12 |

FOREIGN PATENT DOCUMENTS

| | | | |
|---|---|---|---|
| 44-3184 | 2/1969 | Japan | 357/23.12 |
| 45-10531 | 4/1970 | Japan | 357/23.12 |
| 55-26666 | 2/1980 | Japan | 357/23.12 |
| 55-151363 | 11/1980 | Japan | 357/23.12 |
| 56-4279 | 1/1981 | Japan | 357/23.12 |

OTHER PUBLICATIONS

W. S. Johnson, "Multiple Masking Technique in Ion Implantation", IBM Technical Disclosure Bulletin, vol. 15 (1972), pp. 660–661.

*Primary Examiner*—J. Carroll
*Attorney, Agent, or Firm*—Franklyn C. Weiss

[57] ABSTRACT

A depletion mode MOS transistor which can function like a constant current source, when its gate is connected to the source and its drain is held at a fixed voltage even above 40 volts. In addition to heavily doped source and drain regions and a lightly doped, gated channel region, all of one conductivity type, formed in a lightly doped substrate or region of the other conductivity type, the transistor includes thin, heavily doped fingers of the other polarity that extend outwardly from beneath the gate to the grounded barrier ring isolating the transistor from other devices in the substrate. The fingers eliminate the flow of parasitic source to drain currents normally existing between the sides of the gate electrode and the barrier, thus providing a depletion mode MOS transistor having an $I_{SD}$ vs. $V_S$ characteristic more like that of a constant current source when the gate is connected to the source.

2 Claims, 6 Drawing Figures

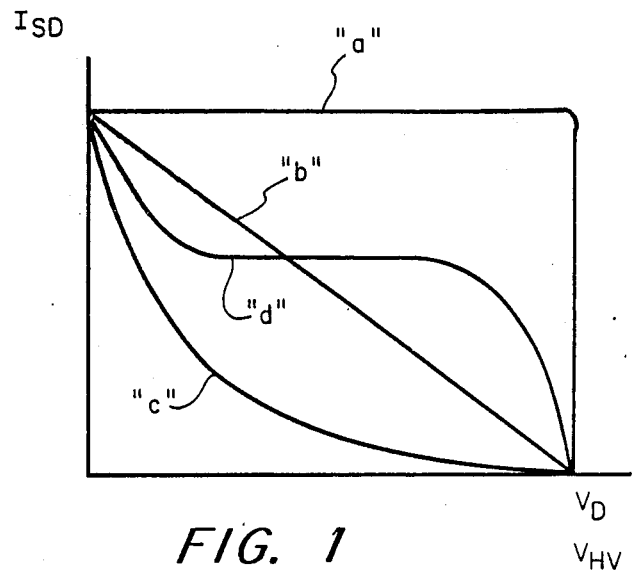
FIG. 1
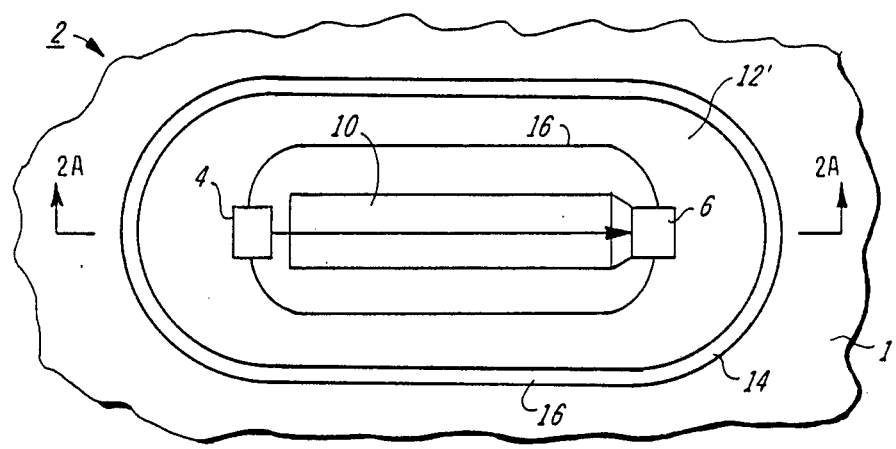
PRIOR ART   FIG. 2

HIGH VOLTAGE DEPLETION MODE TRANSISTOR WITH SERPENTINE CURRENT PATH

This is a continuation of application Ser. No. 588,172, filed Mar. 12, 1984, abandoned.

BACKGROUND OF THE INVENTION

Constant current sources, ideally providing an $I_{SD}$ vs. $V_S$ characteristic exhibiting a constant current flow over a wide range of voltages, are desirable for many circuit applications. For example, in some solid state MOS inverting push-pull amplifiers, it would be advantageous, for fast rise time and low power dissipation, to have the gate of the output stage coupled to a constant current source such that the same level of current is provided to the gate of the output pull-up transistor for all values of gate voltage. Although not having the idealized $I_{SD}$ vs. $V_S$ characteristic of a constant current source, resistors have been utilized in applications requiring a constant current source by holding one side at a fixed voltage. Although resistors are readily useable in discrete component systems, they are undesirable in VLSI solid state circuits because resistors of appropriate value would require extremely large segments of low conductivity material, such as appropriately doped polysilicon, n+ diffusion or metal commonly available in MOS integrated circuitry.

Depletion mode MOS transistors may be useable as constant current sources in low voltage (10 v max.) VLSI solid state circuits. However, for high voltage VLSI solid state circuits, depletion mode MOS transistors exhibit an $I_{SD}$ vs. $V_S$ ($V_D$=high voltage) characteristic which is far removed from the idealized $I_{SD}$ vs. $V_S$ characteristic of a constant current source to provide that function. Accordingly, there is a need for a depletion mode transistor that will have an $I_{SD}$ vs. $V_S$ characteristic substantially like that of a constant current source.

SUMMARY OF THE INVENTION

A depletion mode MOS transistor which can function like a constant current source, when its gate is connected to the source and its drain is held at a fixed voltage even above 40 volts. In addition to heavily doped source and drain regions and a lightly doped, gated channel region, all of one conductivity type, formed in a lightly doped substrate or region of the other conductivity type, the transistor includes thin, heavily doped fingers of the other polarity that extend outwardly from beneath the gate to the grounded barrier ring isolating the transistor from other devices in the substrate. The fingers eliminate the flow of parsitic source to drain currents normally existing between the sides of the gate electrode and the barrier, thus providing a depletion mode MOS transistor having an $I_{SD}$ vs. $V_S$ characteristic more like that of a constant current source when the gate is connected to the source.

BRIEF DESCRIPTION OF THE DRAWINGS

FIG. 1 shows $I_{SD}$ vs. $V_S$ characteristics for an idealized constant current source and for several devices including the depletion mode MOS transistor of the invention.

FIGS. 2 and 2a are plane and sectional (slightly elongated) views, respectively, of a depletion mode MOS transistor not having an $I_{SD}$ vs. $V_S$ characteristic like a constant current source.

DETAILED DESCRIPTION OF THE INVENTION

Figure 2A:
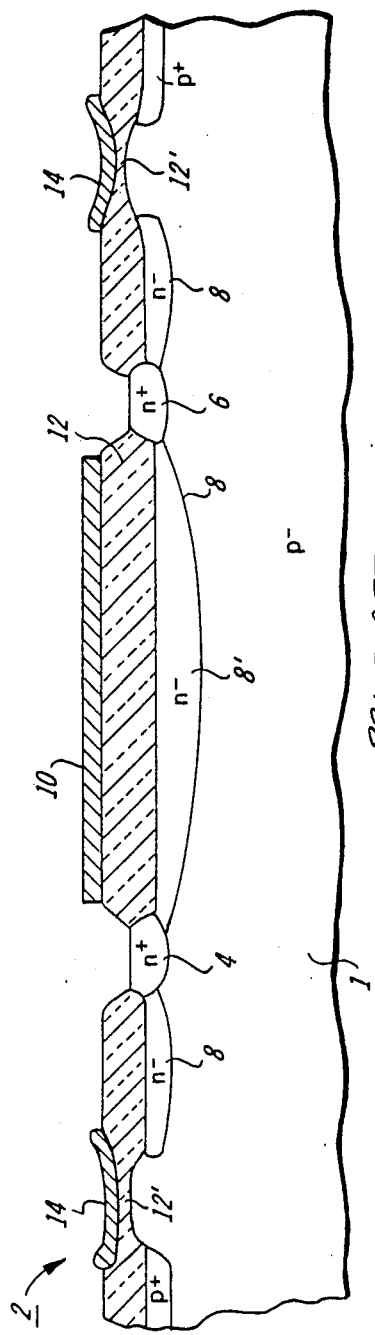

Referring first to FIG. 1, curve "a" shows an idealized $I_{SD}$ vs. $V_S$ characteristic of a constant current source, curve "b" shows the $I_{SD}$ vs. $V_S$ characteristic of a resistor, and curve "c" shows the $I_{SD}$ vs. $V_S$ characteristic achievable by a conventional depletion mode MOS transistor 2 such as that shown in FIG. 2.

Referring further to FIG. 2, the MOS transistor 2 includes a lighty doped p-type (p−) substrate or wafer 1, heavily doped n-type (n+) source and drain regions 4 and 6, respectively, and a lightly doped n-type (n−) region 8 including a channel region 8' between the source and drain regions. A gate electrode 10 is positioned over the channel region, but separated therefrom by a thick field dielectric layer 12. The source, drain and channel regions are surrounded by a conductive barrier ring 14, such as of polysilicon, which is disposed over a thin dielectric layer 12'. Ring 14 is normally at the potential of the back, or bottom side, of the substrate 1 and serves to isolate the transistor 2 from other devices formed in the substrate 1.

Curve "c" of FIG. 1 clearly shows that transistor 2 cannot act like a constant current source, due to the fact that there is heavy source to drain current only at low source voltages and substantially no source to drain current at high source voltages. The $I_{SD}$ vs. $V_S$ characteristic of transistor 2 is due in part to the "substrate" or "bulk" effect which, as is well known, causes the substrate to act as a gate tending to turn off current flow along the channel and, more importantly here, to parasitic conduction paths 16 from source 4 to drain 6 existing on either side of the gate electrode 10 between the gate electrode and the barrier 14. Unlike source to drain current paths beneath the gate, the parasitic conduction paths 16 are not controlled by the electric field of the gate, and are of higher value than currents under the gate at low source voltage. Since the parasitic conduction paths are not controlled and are large, they contribute to the undesirable $I_{SD}$ vs. $V_S$ characteristic of curve "c" of FIG. 1.

Figure 3A:
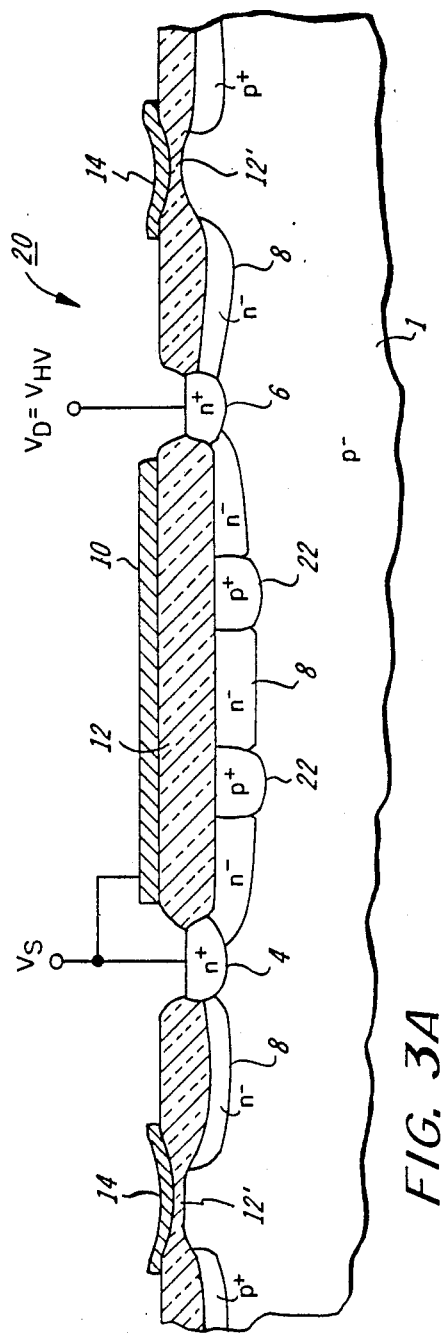
FIGS. 3 and 3a are plane and sectional (slightly elongated) views of a depletion mode MOS transistor in accordnce with the invention having an $I_{SD}$ vs. $V_S$ characteristic like a constant current source.
Figure 3:
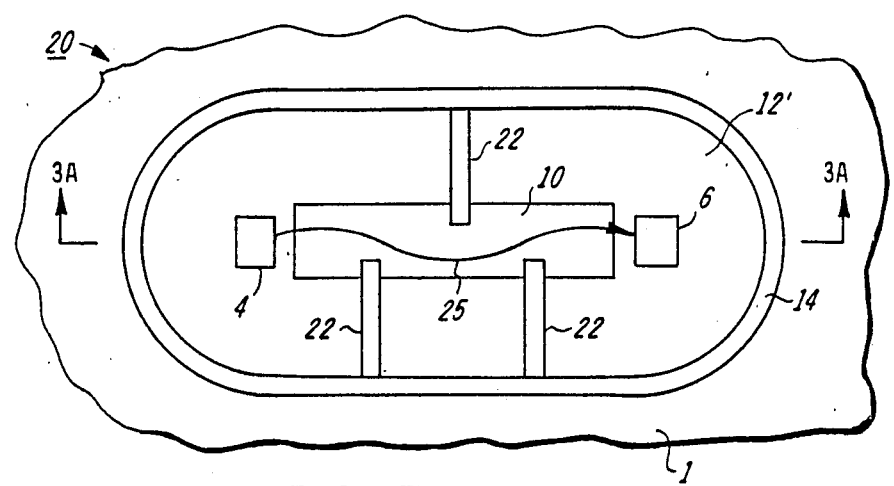

The novel depletion mode MOS transistor 20 of FIG. 3 eliminates the aforediscussed parasitic conduction paths. Transistor 20 is identical to transistor 2 except for the introduction of thin, highly doped p-type (P+) regions or fingers 22 that extend from the barrier ring 14 to under the gate 10. The junctions formed by the fingers 22 halt the flow of parasitic currents along the paths between the gate and barrier ring and directs those currents under the gate along a sepentine path as shown in FIG. 3. The $I_{SD}$ vs. $V_S$ characteristic of depletion mode MOS transistor 20, with the gate connected to the source, is illustrated as curve "d" in FIG. 1. As curve "d" shows, after an initial high source to drain current flow at low drain voltage, a substantially constant value of source to drain current is provided over a large range of source voltages. Thus, the introduction of fingers 22, which serve to confine all source to drain current to serpentine paths beneath the gate as shown in FIG. 3, causes the transistor 20 to behave much like a constant current source, when the gate is connected to the source.

The fingers 22 must be very thin, on the order of three microns and the spacing between fingers should, for example, be between eight and twenty microns. Due to fingers 22 being very thin, they will be depleted completely of free carriers before the avalanche breakdown voltage of the junctions associated with the fingers is reached. The electric field due to the fingers 22 will not continue to rise after the fingers 22 are depleted of free carriers because all available charge has been exposed. Thus, after depletion of fingers 22, the electric field due to fingers 22 will only increase the depletion of free carriers in the substrate. The initial dip shown in curve "d" is due to the reduction of free carriers in the channel 25 resulting from fingers 22 depleting along with a portion of lightly doped n-type region 8. As shown by curve "d", transistor 20 can provide a satisfactory conatant current source $I_{SD}$ vs. $V_S$ characteristic.

As noted, with the gate connected to the source, the transistor 20 will behave much like a constant current source. The transistor 20 could be used, however, with the voltage of the gate set independently of the source voltage. Independent source and gate voltages would not effect the function of fingers 22.

Figure 4:
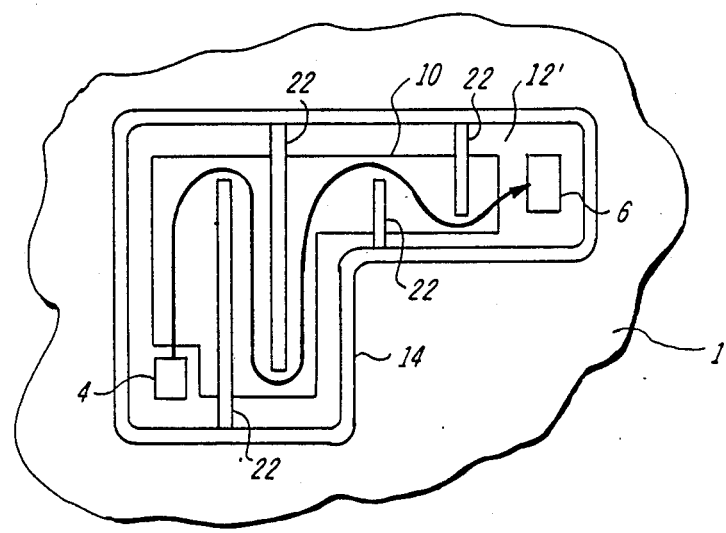
FIG. 4 is a plane view of a depletion mode MOS transistor in accordance with the invention of non-symmetric geometry having an $I_{SD}$ vs. $V_S$ characteristic like a constant current source.

The transistor of FIG. 3 has a symmetric path from source to drain. However, other configurations or shapes can be constructed to permit compact structures that use space efficiently, such as the MOS transistor shown in FIG. 4 wherein an angled or non-symmetric geometry is shown.

The same structures could also be constructed as p channel devices if the polarities of the implants and the applied voltages were reversed.

The MOS transistor 20 of FIG. 3 can be produced by standard processing. For example, the lightly doped p-type substrate 1 is first uniformly oxidized and a layer of silicon nitride is deposited on the oxide. The pattern of the field oxide is defined by masking portions of the silicon nitride with photoresist and etching away the exposed silicon nitride. The field implant is then done to define the p+ regions 22. A second layer of photo resist is then applied over the first layer and patterned to select the field oxide regions that will receive the n− implant. Phosphorous is now implanted to form the n− region 8 of FIG. 3a. Both layers of resist are then stripped off.

Field oxide 12 is now grown and the remaining silicon nitride is etched away. The initial oxide layer is then etched away and the gate oxide 12′ is grown. Photoresist masking defines which transistors will be depletion mode and the depletion implant is done followed by stripping of the photoresist.

A masking defines where the gate oxide is to be etched to make a polysilicon to substrate contact. The oxide is etched and the photoresist is stripped away. Then, polysilicon is deposited, masked and etched, followed by stripping of the photoresist, and Phosphorous diffusion into the polysilicon is now done to make ring 14 and gate 10 conductive.

The oxide on the exposed thin oxide regions now is etched away and Arsenic is implanted to form the n+ regions 4 and 6. Following the implant, a short oxidation is done and silicon dioxide is deposited. The wafer is then masked for contacts and the contact etch is done through to the n+ diffusions or the polysilicon.

After stripping the photoresist, a Phosphorous deposition and diffusion is performed to make the metal to silicon contact low resistance. Metal is then deposited, masked and etched, followed by stripping of the resist. Silicon dioxide is now deposited, masked and etched to define pad openings, the resist then being stripped. The back side of the wafer is etched back to the silicon substrate and gold is deposited, followed by alloying the gold to the silicon to complete the formation of transistor 20.

We claim:

1. An MOS transistor including source and drain regions of one conductivity type formed in a substrate of the other conductivity type, a channel region of said one conductivity type between and connecting said source and drain regions, a gate electrode overlying at least a portion of said channel region, and a conductive barrier ring displaced from and surroundings said regions, the improvement comprising a plurality of thin, highly doped, non-opposed, surface regions of said other conductivity type extending from said barrier ring to beneath said gate electrode for restricting the flow of source to drain current to a serpentine path beneath said gate electrode.

2. An MOS transistor including source and drain regions of one conductivity type formed in a substrate of the other conductivity type, a channel region of said one conductivity type extending longitudinally between and connecting said source and drain regions, and a gate electrode overlying at least a portion of said channel region, the improvement comprising a plurality of thin, highly doped, non-opposed, surface regions of said other conductivity type extending substantially perpendicular to the longitudinal extent of said channel region, each of said thin regions having only a portion thereof extending beneath said gate electrode, the remaining portion of at least one of said thin regions extending in a first direction relative to said gate electrode and the remaining portion of at least one other of said thin regions extending in a direction substantially opposite said first direction for restricting the flow of source to drain current to a serpentine path beneath said gate electrode.

* * * * *